United States Patent
Ye

(10) Patent No.: US 8,276,860 B2
(45) Date of Patent: Oct. 2, 2012

(54) MOUNTING APPARATUS FOR BLOWER

(75) Inventor: Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 230 days.

(21) Appl. No.: 12/889,422

(22) Filed: Sep. 24, 2010

(65) Prior Publication Data

US 2012/0048815 A1 Mar. 1, 2012

(30) Foreign Application Priority Data

Aug. 30, 2010 (CN) .......................... 2010 1 0266703

(51) Int. Cl.
*F16M 11/00* (2006.01)

(52) U.S. Cl. ...... 248/201; 248/200; 415/126; 415/213.1

(58) Field of Classification Search ............... 16/87.4 R, 16/90, 95 R, 96 R, 101; 415/126; 454/184; 211/88.02, 94.01, 113, 119.008, 119.009, 211/126.15, 94, 117, 70.6; 248/657, 429, 248/295.11, 297.21, 343, 224.61, 430, 200.1, 248/201, 906, 317, 323, 316.8

See application file for complete search history.

(56) References Cited

U.S. PATENT DOCUMENTS

| 2011/0021132 A1* | 1/2011 | Chou et al. ..................... 454/184 |
| 2011/0070070 A1* | 3/2011 | Ye .................................. 415/126 |
| 2011/0260026 A1* | 10/2011 | Ye et al. ...................... 248/298.1 |
| 2011/0297803 A1* | 12/2011 | Tang et al. ..................... 248/201 |

* cited by examiner

*Primary Examiner* — Amy Sterling
*Assistant Examiner* — Erin W Smith
(74) *Attorney, Agent, or Firm* — Altis Law Group, Inc.

(57) ABSTRACT

A mounting apparatus for a blower includes a parallel pair of racks, a pair of sliding rails attached to the racks and capable of sliding along the racks, a pair of seats attached to the rails and capable of sliding along the rails, two pairs of positioning members extending through the racks and engaging with the rails to position the rails on the racks, and a pair of fasteners extending through the blower to engage with the seats to attach the blower to the seats.

8 Claims, 3 Drawing Sheets

MOUNTING APPARATUS FOR BLOWER

BACKGROUND

1. Technical Field

The present disclosure relates to a mounting apparatus, and more particularly to a mounting apparatus for a blower.

2. Description of Related Art

Electronic devices such as central processing units (CPUs) frequently generate large amount of heat during normal operation, which can destabilize operation of the electronic device and possibly cause damage. Oftentimes, a blower is used to dissipate heat from the electronic device. However, the position of such a blower is often hard to be adjusted because it is always secured at a fixed place adjacent to the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
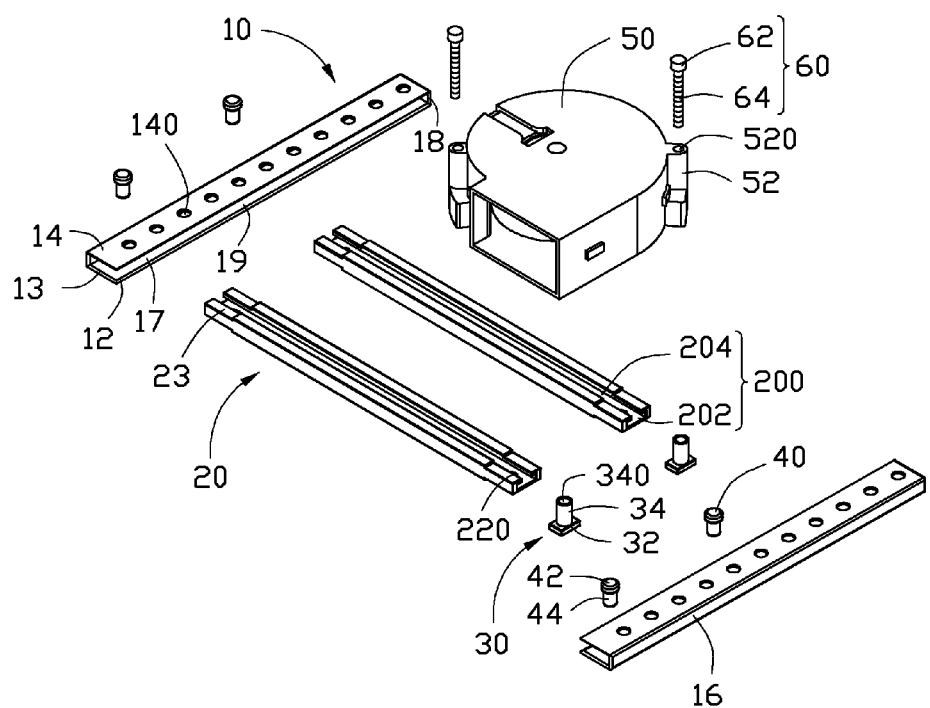
FIG. 1 is an exploded, isometric view of an exemplary embodiment of a mounting apparatus for a blower.
Figure 2:
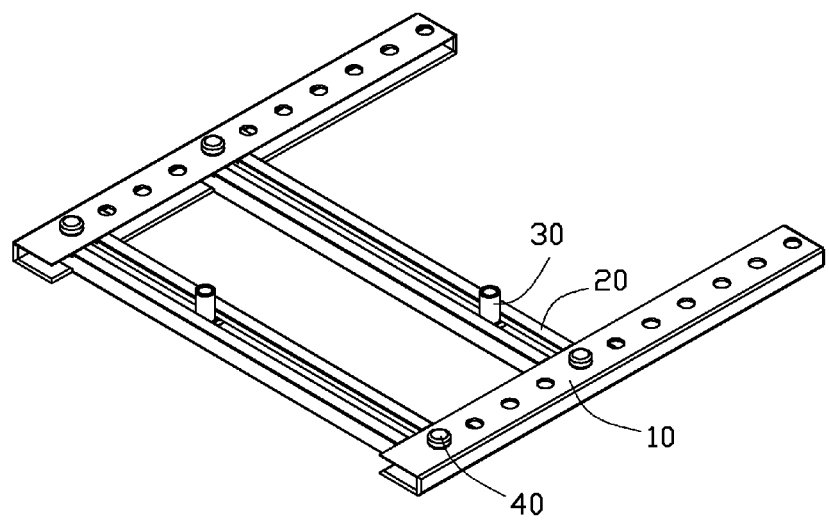
FIG. 2 is a partially assembled, isometric view of the mounting apparatus of FIG. 1.

Referring to FIGS. 1 and 2, an exemplary embodiment of a mounting apparatus 1 is to be used to mount a blower 50 and includes a pair of racks 10, a pair of sliding rails 20, a pair of seats 30, two pairs of positioning members 40, and a pair of fasteners 60.

The blower 50 includes a pair of columns 52 each with mounting hole 520 extending from opposing ends thereof, and an outlet for expelling airs.

Each rack 10 includes an elongated rectangular base wall 16, a first and a second sidewalls 12, 14 extending perpendicularly from a top edge and a bottom edge of the base wall 16, and an end wall 18 perpendicularly arranged at one end thereof. A channel 19 is defined between the first and second sidewalls 12, 14, the base wall 16, and the end wall 18. A plurality of first positioning holes 140 is defined in the second sidewall 14. A first opening 13 is defined at the other end of the rack 10. A second opening 17 is defined between the first and second sidewalls 12, 14, opposite to the base wall 16.

Each sliding rail 20 is elongated and includes a pair of recessed engaging portions 23 formed at two ends thereof. An inverted T-shaped sliding slot 200 extends through the sliding rail 20 along a length thereof. The sliding slot 200 further extends through two opposite ends of the sliding rail 20 to form two entry points 202 and extends through a middle of a top wall of the rail 20 to form a gap 204. Two second positioning holes 220 are respectively defined in two end portions of a bottom wall of the rail 20.

Each seat 30 is capable of sliding in the sliding slots 200 of the rails 20 and includes a rectangular base 32, and a pole 34 perpendicularly extending from the base 32. The pole 34 includes a threaded hole 340 defined therein along an axis thereof.

Each positioning member 40 includes a head 42, and a post 44 located below the head 42.

The fasteners 60 is a thumb screw and each includes a head 62, and a threaded shaft 64.

Figure 3:
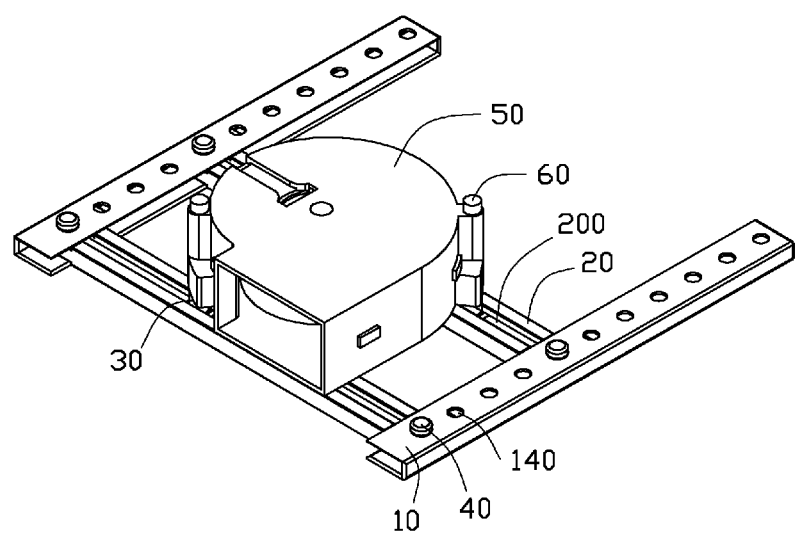
FIG. 3 is a fully assembled, isometric view of the mounting apparatus of FIG. 1 with a blower.

Referring also to FIG. 3, in assembly, the racks 10 in parallel are attached to an electronic device and located beside a circuit board thereof with a heat generating electronic element, according to lengths of the rails 20. The two seats 30 are respectively attached to the two sliding rails 20 through the entry points 202 thereof, with the bases 32 received in the sliding slots 200 and the poles 34 extending through the gaps 204. Sizes of the base 32 of the seat 30 and the gap 204 of the rail 20 are correspondingly designed to prevent the seat 30 from sliding out of the rail 20 from the gap 204. The blower 50 is attached to the two rails 20, with threaded holes 340 of the seats 30 in alignment with the mounting holes 520 of the blower 50. The threaded shafts 64 of the two fasteners 60 extend through the mounting holes 520 to engage the threaded holes 340 of the seats 30 and the heads 62 of the fasteners 60 are located above the blower 50. The two fasteners 60 can be tightened or loosened to secure the blower 50 to the rails 20 or release the blower 50 from the rails 20. Then, the two rails 20 are attached to the racks 10, with the recessed engaging portions 23 of the rails 20 entering into the channels 13 of the tracks 10 from the openings 13 and slidably extending through the openings 17. Then, the posts 44 of the positioning members 40 extend through two pairs of first positioning holes 140 of the racks 10 to engage in the second positioning holes 220 of the rails 20 and the heads 42 of the positioning members 40 are located above the second sidewalls 14 of the racks 10 to position the rails 20 at the racks 10.

In operation, a position of the blower 50 can be adjusted along the rails 20 by loosening the fasteners 60 and sliding the blower 50, with two seats 30 sliding along the sliding slots 200 of the rails 20. A position of the blower 50 along the racks 10 can also be adjusted by pulling the positioning members 40 out of the positioning holes 140 of the racks 10 and sliding them along the two rails 20 in the channels 19 of the racks 10. Similarly, positions of the blower 50 both along the rails 20 and along the racks 10 can be adjusted.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A mounting apparatus for mounting a blower, the mounting apparatus comprising:
    a pair of parallel racks;
    a pair of parallel sliding rails attached to the racks and capable of sliding along the racks;
    a pair of seats respectively attached to the rails and capable of sliding along the rails;
    a pair of fasteners extending through the blower to respectively engage with the seats; and two pairs of positioning members extending through the racks to engage with the rails to position the rails on the racks.

2. The mounting apparatus of claim 1, wherein each rack comprises an elongated rectangular base wall, a pair of sidewalls extending from two edges of the base wall, and an end wall arranged at one end thereof.

3. The mounting apparatus of claim 2, wherein each rail comprises a pair of recessed engaging portions formed at two ends thereof, each rack comprises a channel defined between the sidewalls, the base wall, and the end wall to receive the recessed engaging portions.

4. The mounting apparatus of claim 2, wherein an opening is defined at the other end of the rack.

5. The mounting apparatus of claim 2, wherein a plurality of first positioning holes is defined in one of the sidewalls of each rack, a pair of second positioning holes is defined in each sliding rail, the positioning members extend through the first positioning holes to engage in the second positioning hole.

6. The mounting apparatus of claim 1 wherein each the rail comprises an inverted T-shaped sliding slot defined therein and extending a length thereof, to receive the seat therein.

7. The mounting apparatus of claim 6, wherein the sliding slot further extends through two opposite ends of the sliding rail to forms two entries and extends through a middle of a top wall of the rail to form a gap, the seat comprises a base received in the sliding slot, and a pole extending from the post and received in the gap.

8. The mounting apparatus of claim 7, wherein a threaded hole is defined in the pole of each seat, the blower comprises a pair of columns extending from a circumferential surface thereof, a mounting hole is defined in each column, the fasteners extend through the mounting holes of the blower to engage in the seats.

* * * * *